(12) United States Patent
Koizumi et al.

(10) Patent No.: US 12,198,889 B2
(45) Date of Patent: Jan. 14, 2025

(54) ELECTRON GUN, ELECTRON BEAM APPLICATOR, AND METHOD FOR CONTROLLING ELECTRON GUN

(71) Applicant: Photo electron Soul Inc., Nagoya (JP)

(72) Inventors: Atsushi Koizumi, Nagoya (JP); Hokuto Iijima, Nagoya (JP)

(73) Assignee: Photo electron Soul Inc., Nagoya (JP)

(*) Notice: Subject to any disclaimer, the term of this patent is extended or adjusted under 35 U.S.C. 154(b) by 456 days.

(21) Appl. No.: 17/044,850

(22) PCT Filed: May 8, 2020

(86) PCT No.: PCT/JP2020/018715
§ 371 (c)(1),
(2) Date: Oct. 1, 2020

(87) PCT Pub. No.: WO2020/250604
PCT Pub. Date: Dec. 17, 2020

(65) Prior Publication Data
US 2023/0131413 A1    Apr. 27, 2023

(30) Foreign Application Priority Data
Jun. 10, 2019    (JP) ................. 2019-108154

(51) Int. Cl.
*H01J 37/073* (2006.01)
*H01J 37/063* (2006.01)

(52) U.S. Cl.
CPC .......... *H01J 37/073* (2013.01); *H01J 37/063* (2013.01); *H01J 2237/24542* (2013.01); *H01J 2237/2485* (2013.01)

(58) Field of Classification Search
CPC ........ H01J 37/063; H01J 37/07; H01J 37/073; H01J 2237/2485; H01J 2237/24542
See application file for complete search history.

(56) References Cited

U.S. PATENT DOCUMENTS 6,246,190 B1    6/2001    Prior
9,934,926 B2    4/2018    Nishitani
(Continued)

FOREIGN PATENT DOCUMENTS

EP    3608939 A1    2/2020
JP    2002-8575 A    1/2002
(Continued)

OTHER PUBLICATIONS

Geissler, K. et al.: "Intense Laser-Induced Electron Emission From Prepoled Lead-Lanthanum-Zirconium-Titanate Ceramics" Applied Physics Letters, AIP Publishing Llc, US, vol. 56, No. 10, Mar. 5, 1990, pp. 895-897.
(Continued)

*Primary Examiner* — David E Smith
(74) *Attorney, Agent, or Firm* — Intellectual Property Law Group LLP

(57) ABSTRACT

The present disclosure addresses the problem of providing an electron gun that can directly monitor an intensity of an electron beam emitted from a photocathode using only the configuration provided to the electron gun, an electron beam applicator equipped with an electron gun, and a method for controlling an electron gun.

The aforementioned problem can be solved by
an electron gun comprising
a light source,
a photocathode that emits an electron beam in response to receiving light from the light source,
an anode,
an electron-beam-shielding member with which it is possible to shield part of the electron beam, and (Continued)

a measurement unit that measures the intensity of the electron beam emitted from the photocathode using a measurement electron beam shielded by the electron-beam-shielding member.

13 Claims, 6 Drawing Sheets

(56) References Cited

U.S. PATENT DOCUMENTS

| | | |
|---|---|---|
| 10,453,647 B2 | 10/2019 | Mohammadi-Gheidari et al. |
| 2004/0124365 A1 | 7/2004 | Steigerwald |
| 2015/0235800 A1* | 8/2015 | Reed ................ H01J 37/22 250/311 |
| 2018/0233322 A1* | 8/2018 | Gheidari ............ H01J 37/20 |

FOREIGN PATENT DOCUMENTS

| | | | |
|---|---|---|---|
| JP | 2002008575 A * | 1/2002 | |
| JP | 2002-313273 A | 10/2002 | |
| JP | 2003-506830 A | 2/2003 | |
| JP | 3537779 B2 | 3/2004 | |
| JP | 2014235816 A | 12/2014 | |
| JP | WO 2015008561 A1 | 1/2015 | |
| JP | WO 2018186294 A1 | 10/2018 | |
| JP | 2018-190705 A | 11/2018 | |

OTHER PUBLICATIONS

Pronko, S. Ge et al.: "A Short-Pulse, Laser-Driven Photoelectron Diode", Proceedings of the Pulsed Power Conference. Monterey, Jun. 11-24, 1989; [Proceedings of the Pulsed Power Conference], New York, IEEE, US, vol. CONF. 7, Jun. 11, 1989, pp. 453-456.
European Supplementary Partial European Search Report, dated Jun. 29, 2021 for corresponding European application No. 20781301.5 (total 16 pages).
International Search Report and Written Opinion of the ISA, dated Jul. 14, 2020 for corresponding International Application No. PCT/JP2020/018715 with English translation (13 pages).
Daiki Sato et al., "Observation of relaxation time of surface charge limit for InGaN photocathodes with negative electron affinity", 2016 Jpn. J. Appl. Phys. 55, 05FH05 (5 pages).
Japan Office Action, dated Jun. 24, 2019 for corresponding Japanese Patent Application No. 2019-108154 with English translation (12 pages).
China Office Action issued by CNIPA, dated Sep. 24, 2023 for corresponding China application No. 202080002276.7 with English machine translation (total 18 pages).
China Office Action issued by CNIPA, dated Feb. 23, 2024 for corresponding China Patent Application No. 202080002276.7 with English machine translation (total 16 pages).
Decision of Refusal issued by CNIPA, dated Jul. 31, 2024 for corresponding China application No. 202080002276.7 with English machine translation (total 19 pages).
Taiwan Office Action issued by TIPO, dated Apr. 15, 2024 for corresponding Taiwan application No. 109115789 with English machine translation (total 15 pages).
European Office Action, dated Oct. 4, 2024 for corresponding European application No. 20 781 301.5 (8 pages).
Grames, J. et al.: "Lifetime Measurements of High Polarization Strained-Superlattice Gallium Arsenide At Beam Current > 1 Milliamp Using a New 100KV Load Lock Photogun", 03 Linear Colliders, Lepton Accelerators and New Acceleration Techniques, 2007, IEEE, pp. 3130-3132 (total 3 pages).

* cited by examiner

ELECTRON GUN, ELECTRON BEAM APPLICATOR, AND METHOD FOR CONTROLLING ELECTRON GUN

CROSS-REFERENCE TO RELATED APPLICATIONS

This application is a U.S. National Phase application, under 35 U.S.C. § 371, of International Application no. PCT/JP2020/018715, with an international filing date of May 8, 2020, and claims priority to Japanese application no. 2019-108154, filed on Jun. 10, 2019, each of which is hereby incorporated by reference for all purposes.

TECHNICAL FIELD

The disclosure in the present application relates to an electron gun, an electron beam applicator, and a method for controlling an electron gun.

TECHNICAL BACKGROUND

Electron beam applicators such as electron guns equipped with photocathodes, electron microscopes that include these electron guns, free electron laser accelerators, and inspection devices are known (below, electron beam applicators from which an electron gun is removed are also referred to as "counterpart devices"). For example, Patent Document 1 discloses an electron microscope device in which there is used a photocathode that is irradiated with excitation light from a light source and emits an electron beam.

In electron beam applicators such as electron microscope devices, it is necessary to stably maintain emission of the electron beam. However, subjecting the photocathode to continued light irradiation worsens electron emission characteristics of the photocathode and reduces the amount of electrons emitted; therefore, the intensity of an electron beam from an electron beam source in which a photocathode is used decreases with usage time. Therefore, Patent Document 1 discloses increasing the intensity of the excitation light, and/or vapor-depositing Cs and restoring the intensity of the electron beam.

PRIOR ART LIST

Patent Documents

Patent Document 1: Japanese Laid-open Patent Publication No. 2002-313273

SUMMARY OF THE INVENTION

Problems to be Solved by the Invention

In the electron microscope device disclosed in Patent Document 1, it is indicated that the power of a light source (LD) is adjusted by an electron gun controller. However, although it is understood from FIG. 11 that a measurement value from a cathode electric current measurement instrument is fed back to the electron gun controller, the specification does not disclose in what manner the power of the light source (LD) is adjusted. Rather than indirectly measuring the intensity of the electron beam emitted from the photocathode in order to adjust the intensity of the electron beam, it is actually desirable to directly measure the intensity of the electron beam emitted from the photocathode and make adjustments on the basis of the measurement value.

In some instances, only the electron gun is replaced in an electron beam applicator. In addition to electron guns in which photocathodes are used, electron guns in which thermionic cathodes or field emitters are used are also known as electron gun types. Therefore, cases where a counterpart device equipped with an electron gun in which a thermionic cathode or a field emitter is used is newly equipped with an electron gun in which a photocathode is used are also expected. However, in such cases, it is also expected that the intensity of an electron beam emitted from the electron gun in which the photocathode is used cannot be measured by the configuration of the counterpart device. At present, there is no known electron gun that can directly monitor the intensity of an electron beam emitted from a photocathode using only the configuration provided to the electron gun.

The disclosure in the present application provides an electron gun that can directly monitor the intensity of an electron beam emitted from a photocathode using only the configuration provided to the electron gun, an electron beam applicator equipped with an electron gun, and a method for controlling an electron gun. Other arbitrary additional effects of the disclosure in the present application are clarified in the description of the embodiments.

Means to Solve the Problems (1) An electron gun comprising
  a light source,
  a photocathode that emits an electron beam in response to receiving light from the light source, an anode,
  an electron-beam-shielding member with which it is possible to shield part of the electron beam, and
  a measurement unit that measures an intensity of the electron beam emitted from the photocathode using a measurement electron beam shielded by the electron-beam-shielding member.

(2) The electron gun according to (1) above,
  further comprising a control unit that adjusts the intensity of the electron beam emitted from the photocathode in accordance with results of measurements performed by the measurement unit.

(3) The electron gun according to (2) above,
  wherein the control unit controls the intensity of light with which the photocathode is irradiated.

(4) The electron gun according to (2) or (3) above,
  further comprising a photocathode-accommodating vessel in which the photocathode can be accommodated,
  a surface treatment material for surface-treating the photocathode being disposed inside the photocathode-accommodating vessel, and
  the control unit accommodating the photocathode inside the photocathode-accommodating vessel and surface-treating the photocathode using the surface treatment material.

(5) The electron gun according to any of (1) to (4) above,
  further comprising an intermediate electrode disposed between the photocathode and the anode, the intermediate electrode making it possible to change a width of the electron beam by applying a voltage.

(6) The electron gun according to any of (1) to (5) above,
  wherein the light source emits frequency-modulated light, and
  the measurement unit comprises a signal extractor that extracts a signal having a frequency corresponding to a modulation frequency of the frequency-modulated light.

(7) An electron beam applicator comprising the electron gun according to any of (1) to (6) above,
  wherein the electron beam applicator is
  a free electron laser accelerator,
  an electron microscope,
  an electron-beam holography device,
  an electron-beam drawing device,
  an electron-beam diffraction device,
  an electron-beam inspection device,
  an electron-beam metal additive manufacturing device,
  an electron-beam lithography device,
  an electron beam processing device,
  an electron-beam curing device,
  an electron-beam sterilization device,
  an electron-beam disinfection device,
  a plasma generation device,
  an atomic element generation device,
  a spin-polarization electron-beam generation device,
  a cathode luminescence device, or
  an inverse photoemission spectroscopy device.

(8) A method for controlling an electron gun that monitors an intensity of an electron beam emitted from a photocathode comprising
  a light source,
  a photocathode that emits an electron beam in response to receiving light from the light source,
  an anode,
  an electron-beam-shielding member with which it is possible to shield part of the electron beam, and
  a measurement unit that measures an intensity of the electron beam emitted from the photocathode using a measurement electron beam shielded by the electron-beam-shielding member,
  wherein the method for controlling an electron gun comprises:
  a step for irradiating the photocathode with excitation light from the light source, and emitting an electron beam from the photocathode in response to receiving the excitation light; and
  a step for measuring the intensity of the electron beam using the measurement electron beam shielded by the electron-beam-shielding member.

(9) The method for controlling an electron gun according to (8) above,
  wherein the electron gun further comprises a control unit that adjusts the intensity of the electron beam emitted from the photocathode in accordance with results of measurement performed by the measurement unit, and
  the method for controlling an electron gun comprises a step for adjusting the intensity of the electron beam emitted from the photocathode in accordance with the intensity of the electron beam measured in the step for measuring the intensity of the electron beam.

(10) The method for controlling an electron gun according to (9) above,
  wherein the step for adjusting the intensity of the electron beam involves controlling the intensity of the light with which the photocathode is irradiated.

(11) The method for controlling an electron gun according to (9) or (10) above,
  wherein a photocathode-accommodating vessel in which the photocathode can be accommodated is included,
  a surface treatment material for surface-treating the photocathode is disposed inside the photocathode-accommodating vessel, and
  the step for adjusting the intensity of the electron beam involves accommodating the photocathode inside the photocathode-accommodating vessel and surface-treating the photocathode using the surface treatment material.

(12) The method for controlling an electron gun according to any of (8) to (11) above,
  wherein an intermediate electrode disposed between the photocathode and the anode is further provided, and
  the method for controlling an electron gun comprises a step for applying a voltage to the intermediate electrode and changing a width of the electron beam.

(13) The method for controlling an electron gun according to any of (8) to (12) above,
  wherein the excitation light is frequency-modulated light, and
  the step for measuring the intensity of the electron beam involves extracting and measuring a signal having a frequency corresponding to a modulation frequency of the frequency-modulated light.

Advantageous Effects of the Invention

According to the disclosures in the present application, it is possible to directly monitor the intensity of an electron beam emitted from a photocathode using only a configuration provided to an electron gun.

DESCRIPTION OF THE EMBODIMENTS

Figure 1:
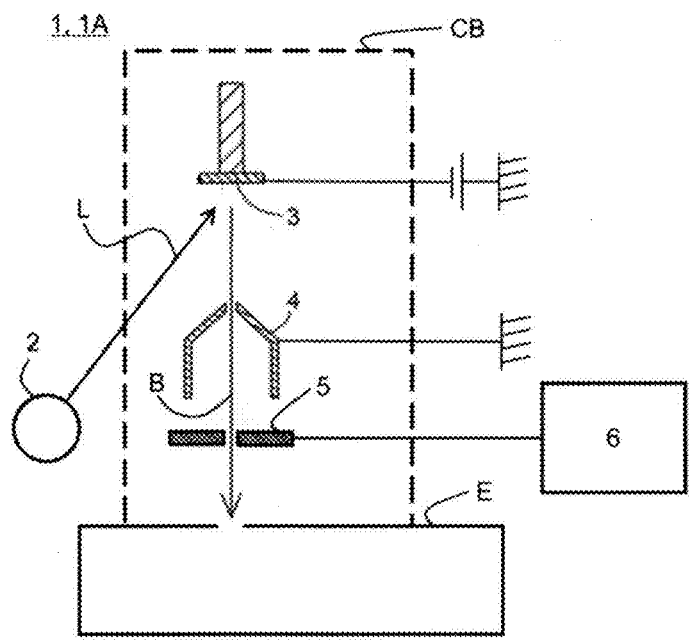
FIG. 1 is a schematic view illustrating an electron gun 1A in a first embodiment, and a counterpart device equipped with the electron gun 1A.

Below is a detailed description, made with reference to the drawings, of an electron gun, an electron beam applicator, and a method for controlling an electron gun. In the present specification, members having the same function are designated by the same or similar symbols. In some instances, members designated by the same or similar symbols are described no more than once.

In some instances, to facilitate understanding, the positions, sizes, ranges, etc., of the configurations shown in the drawings do not depict actual positions, sizes, ranges, etc. Therefore, the disclosure in the present application is not necessarily limited to the positions, sizes, ranges, etc., that are set forth in the drawings.

(Definitions of Directions)

In the present specification, Z is a direction in which an electron beam emitted from a photocathode propagates. The Z direction is, for example, a vertically downward direction, but the Z direction is not limited to a vertically downward direction.

First Embodiment

Figure 2:
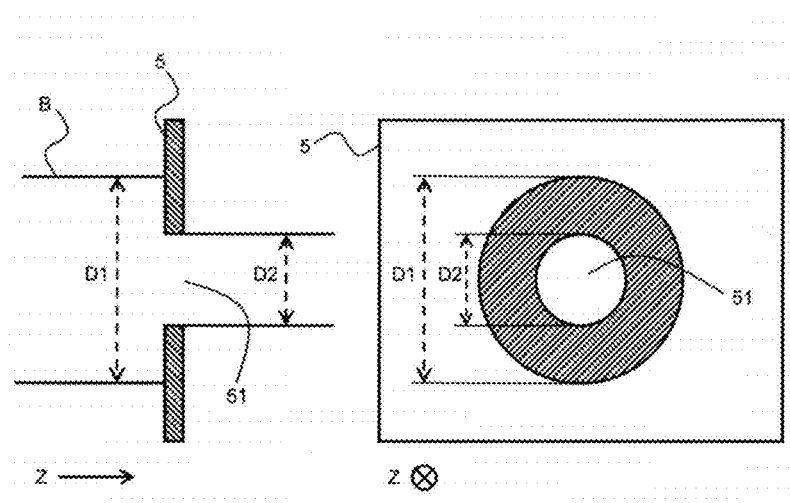
FIG. 2 is a view illustrating an electron-beam-shielding member in the first embodiment.

An electron gun 1A in a first embodiment is described with reference to FIGS. 1 and 2. FIG. 1 is a schematic view illustrating the electron gun 1A in the first embodiment, and a counterpart device E equipped with the electron gun 1A. FIG. 2 is a view illustrating an electron-beam-shielding member 5 as seen from a direction perpendicular to the Z direction, and an electron-beam-shielding member 5 as seen from the Z direction.

The electron gun 1A in the first embodiment comprises a light source 2, a photocathode 3, an anode 4, the electron-beam-shielding member 5, and a measurement unit 6.

There is no particular limitation as to the light source 2, provided that an electron beam B can be emitted due to the photocathode 3 being irradiated with excitation light L. Examples of the light source 2 include high-output (watt-class), high-frequency (hundreds of MHz), ultrashort-pulse laser light sources, comparatively inexpensive laser diodes, and LEDs. The excitation light L to be emitted may be pulsed or continuous, and is preferably adjusted as appropriate in accordance with a purpose. In the example shown in FIG. 1, the light source 2 is disposed outside of a vacuum chamber CB, and the front-surface side of the photocathode 3 is irradiated with excitation light L. Alternatively, the light source 2 may be disposed inside the vacuum chamber CB, and the rear surface of the photocathode 3 may be irradiated with the excitation light L.

In the example shown in FIG. 1, the photocathode 3, the anode 4, and the electron-beam-shielding member 5 are disposed inside the vacuum chamber CB. The photocathode 3 emits an electron beam B in response to receiving the excitation light L emitted from the light source 2. More specifically, electrons within the photocathode 3 are excited by the excitation light, and the excited electrons are emitted from the photocathode 3. The emitted electrons are formed into the electron beam B by an electrical field formed by the anode 4 and the cathode 3. As pertains to the terms "photocathode" and "cathode" in the present specification, there are instances where "photocathode" is used when referring to emission of the electron beam, and where "cathode" is used when referring to an electrode that is counter to the "anode"; however, the reference sign "3" is used for both "photocathode" and "cathode."

There is no particular limitation as to a photocathode material for forming the photocathode 3, provided that it is possible for the photocathode material to emit an electron beam due to being irradiated with excitation light. Examples of the photocathode material include materials that require EA surface treatment, and materials that do not require EA surface treatment. Examples of materials that require EA surface treatment include III-V group semiconductor materials and II-VI group semiconductor materials. Specific examples include AlN, $Ce_2Te$, GaN, compounds of Sb with one or more alkali metals, AlAs, GaP, GaAs, GaSb, and InAs, as well as mixed crystals of these. Other examples of such materials include metals; specific examples including Mg, Cu, Nb, $LaB_6$, $SeB_6$, and Ag. The photocathode 3 can be fabricated by subjecting the photocathode material to EA surface treatment, and, with this photocathode 3, not only will it be possible to select excitation light from within a near-ultraviolet to infrared wavelength region corresponding to the gap energy of the semiconductor, but it will also be possible for the electron-beam source capabilities (quantum yield, durability, monochromaticity, temporal response, and spin polarization) corresponding to the electron beam application to be exhibited by selecting the material and structure of the semiconductor.

Examples of materials that do not require EA surface treatment include: Cu, Mg, Sm, Tb, Y, and other single metals, or alloys or metal compounds thereof; and diamond, WBaO, and $Cs_2Te$. A photocathode that does not require EA surface treatment is preferably fabricated through a publicly known method (for example, see Japanese Patent No. 3537779).

There is no particular limitation as to the anode 4, provided that it is possible to form an electrical field together with the cathode 3. An anode that is typically used in the field of electron guns can be used as the anode 4.

There is no particular limitation as to the disposition of a power source, provided that it is possible for the electron beam B to be emitted from the cathode 3 toward the anode 4. In the example shown in FIG. 1, the power source is disposed so that a difference in potential is generated between the cathode 3 and the anode 4, whereby an electrical field can be formed.

The electron-beam-shielding member 5 comprises a hole 51 through which part of the electron beam B emitted from the photocathode 3 passes.

In the first embodiment, the width of the hole 51 is less than the width of the electron beam B. As illustrated in FIG. 2, where D1 indicates the width of the electron beam B upon arrival at the electron-beam-shielding part 5 and D2 indicates the width of the hole 51, a portion of the electron beam B that overlaps the hole 51 passes through the electron-beam-shielding member 5. However, a difference portion of the electron beam B that does not pass through the hole 51 is shielded by the electron-beam-shielding member 5. The electron beam shielded by the electron-beam-shielding member 5 is used as a "measurement electron beam," and the intensity is measured in the measurement unit 6. There is no particular limitation as to D2, provided that D2 is large enough to allow an electron beam of a desired amount of electrons to pass through. There is also no particular limitation as to the magnitude of D1/D2, provided that a measurement electron beam that can be measured by the measurement unit 6 is obtained. As the magnitude of D1/D2 increases, the amount of electrons in the measurement electron beam commensurately increases, as does the precision of measurement in the measurement unit 6, but the amount of electrons in the electron beam B emitted from the photocathode 3 that enters the counterpart device E decreases, and the operating efficiency of the electron beam applicator worsens. Conversely, if D1/D2 is too small, the amount of electrons in the measurement electron beam decreases, as does the precision of measurement in the measurement unit 6. Therefore, the magnitudes of D1 and D2 are preferably adjusted as appropriate in consideration of measurement precision and operating efficiency.

FIGS. 1 and 2 show an example in which the measurement electron beam is constantly acquired from the electron beam B. In the first embodiment, the width of the hole 51 is less than the width of the electron beam B, but the width of the hole 51 may be greater than that of the electron beam B. In such cases, it is also possible, e.g., to provide movement means (not shown) that causes the electron-beam-shielding member 5 to move is provided, to move the electron-beam-shielding member 5 so as to be overlapped by part of the electron beam B, and also to acquire part of the electron beam B as the measurement electron beam at a prescribed timing.

There is no particular limitation as to the material of the electron-beam-shielding member 5, provided that the material is a conductor or a semiconductor. Examples of conductors include stainless steel (SUS), copper, and other metals.

The measurement unit 6 measures the intensity of the electron beam B using the measurement electron beam, which is the part of the electron beam B that is shielded by the electron-beam-shielding member 5. There is no particular limitation as to the measurement unit 6, provided that it is possible to measure the intensity of the electron beam B. For example, when the electron-beam-shielding member 5 is a conductor, an electric current is produced between the electron-beam-shielding member 5 and the measurement unit 6 due to the measurement electron beam. Therefore, the intensity of the electron beam B can be measured as an electric current value in the measurement unit 6. The electric current value is preferably measured using a publicly known ammeter. The measured electric current value depends on the intensity of the electron beam B, and therefore it is possible to monitor variations in the intensity of the electron beam B by monitoring variations in the electric current value. It is also possible to use a semiconductor as the electron-beam-shielding member 5 and measure the electric current value produced due to the measurement electron beam hitting the semiconductor.

The measurement unit 6 may measure the intensity of the electron beam B through the intensity of fluorescence rather than the electric current value. More specifically, a conductor to which a fluorescent material has been applied in advance may be used as the electron-beam-shielding member 5, and the intensity of fluorescence generated due to the measurement electron beam hitting the fluorescent material may be measured by the measurement unit 6. The intensity of fluorescence is preferably measured using a publicly known fluorophotometer.

In the first embodiment, the electron-beam-shielding member 5 is disposed inside the electron gun 1A and part of the electron beam B is shielded, whereby it is possible to directly monitor variations in the intensity of the electron beam B. Therefore, as shown in the examples (described later), it is possible to ascertain variations in the intensity of the electron beam B in real time, and therefore the first embodiment exhibits the effect of making it possible to restore the intensity of the electron beam at a suitable timing. Furthermore, the first embodiment also exhibits the effect of making it possible to confirm in real time whether the electron beam B has a prescribed intensity, even when having made an adjustment that varies the intensity of the electron beam B while the electron beam applicator is running.

The electron gun 1A in the first embodiment can directly monitor the intensity of the electron beam B emitted from a photocathode 3 using only the configuration provided to the electron gun 1A. Therefore, the first embodiment also exhibits the effect of making it possible to monitor the intensity of the electron beam B irrespective of the configuration of the counterpart device E.

Second Embodiment

Figure 3:
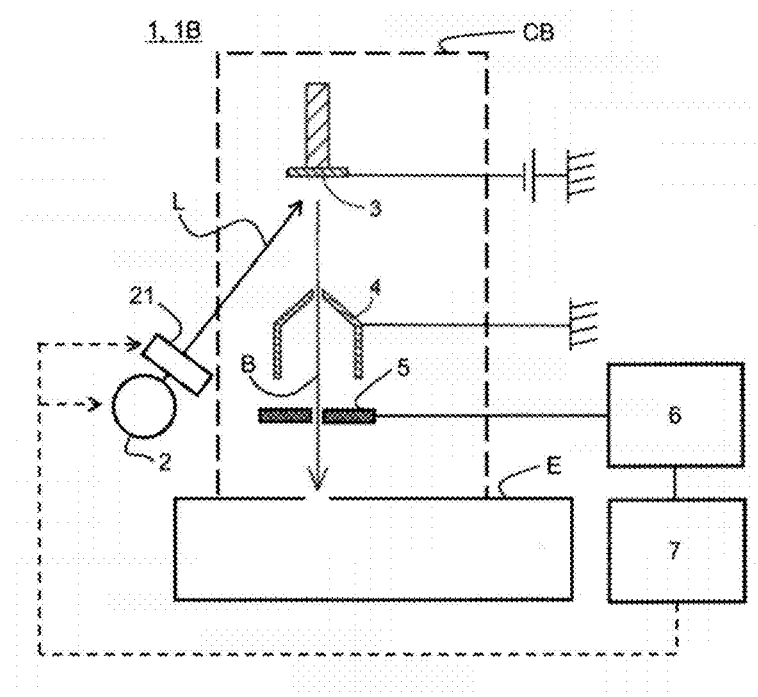
FIG. 3 is a schematic view illustrating an electron gun 1B in a second embodiment, and a counterpart device equipped with the electron gun 1B.

An electron gun 1B in a second embodiment is described with reference to FIG. 3. FIG. 3 is a schematic view illustrating an example of the electron gun 1B in the second embodiment.

The electron gun 1B in the second embodiment comprises a light source 2, a photocathode 3, an anode 4, an electron-beam-shielding member 5, a measurement unit 6, and a control unit 7.

The control unit 7 adjusts the intensity of the electron beam B emitted from the photocathode 3 in accordance with measurement results obtained through measurements performed by the measurement unit 6. When the electron gun 1B is used for a certain period of time, the intensity of the electron beam B decreases due to degradation of the photocathode 3, and therefore the measurement value obtained by the measurement unit 6 also decreases. When, for example, the measurement value falls below a preset threshold value, the control unit 7 controls the light source 2 and varies the intensity of the excitation light L with which the photocathode 3 is irradiated, whereby it is possible to adjust the intensity of the electron beam B emitted from the photocathode 3. The control unit 7 can also control the light source 2 in each prescribed period of time on the basis of the measurement value (feedback control), whereby the intensity of the excitation light L can be adjusted so that the electron beam B reaches a desired intensity. The frequency of feedback control is preferably set as appropriate in consideration of the stability of the intensity of the electron beam B. For example, feedback control is preferably performed in units ranging from seconds to minutes. The control in the control unit 7 can, for example, be performed using PID control, etc.

The light source 2 is preferably controlled according to the intensity of the excitation light L with which the photocathode 3 is irradiated as described above. Alternatively, an attenuator 21 may be used. Disposing the attenuator 21 between the light source 2 and the photocathode 3 yields the same intensity of light released by the light source 2, but makes it possible to adjust the intensity of the excitation light L with which the photocathode 3 is irradiated. As shall be apparent, both the light source 2 and the attenuator 21 may be controlled.

The electron gun 1B in the second embodiment synergistically exhibits the following effects in addition to the effects of the electron gun 1A in the first embodiment.

It is possible to adjust the intensity of the electron beam B according to the configuration adopted on the electron gun 1B, irrespective of the configuration of the counterpart device E. Therefore, the light source 2 and/or the attenuator 21 is controlled using the control unit 7 so that the intensity of the electron beam B emitted from the photocathode 3 is fixed, whereby it is possible for a stable electron beam B having little variation in intensity to enter the counterpart device E. In addition, the object to be irradiated with the electron beam B can be a variety of objects, such as a biological or non-biological sample if the electron beam applicator is an electron microscope, or a semiconductor substrate if the electron beam applicator is an electron beam inspection device. The intensity with which the electron beam B is emitted differs depending on the object. In addition, in the case of an electron microscope, there are also instances in which the intensity of the electron beam B with which a specimen is irradiated is varied in order to confirm, inter alia, how readily the specimen will be damaged. The electron gun 1B in the second embodiment comprises the control unit 7, whereby it is possible to make adjustments, using only the configuration adopted on the electron gun 1B, so that the electron beam 1B entering the counterpart device E reaches a desired intensity. Creating a table from the relationships among the sizes of D1 and D2, the measurement values obtained by the measurement unit 6, and the intensity of the electron beam with which the object to be irradiated with the electron beam B in the counterpart device E is actually irradiated makes it possible to adjust the intensity of the electron beam B entering the counterpart device E according to the configuration adopted on the electron gun 1.

Third Embodiment

Figure 4:
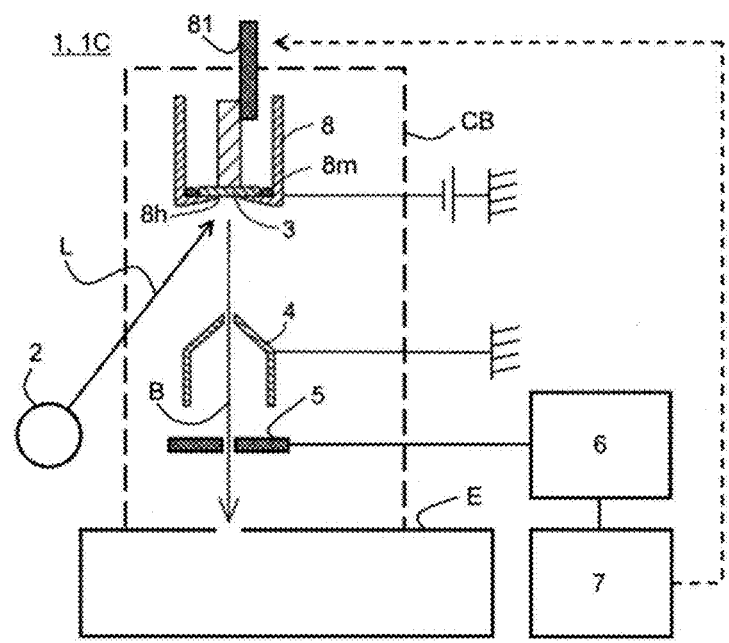
FIG. 4 is a schematic view illustrating an electron gun 1C in a third embodiment, and a device equipped with the electron gun 1C.

An electron gun 1C in a third embodiment is described with reference to FIG. 4. FIG. 4 is a schematic view illustrating an example of the electron gun 1C in the third embodiment.

The electron gun 1C in the third embodiment shown in FIG. 4 comprises a light source 2, a photocathode 3, an anode 4, an electron-beam-shielding member 5, a measurement unit 6, a control unit 7, and a photocathode-accommodating vessel 8. The photocathode 3 is disposed inside the photocathode-accommodating vessel 8, which comprises an electron-beam passage hole 8h. A surface treatment material 8m for subjecting the photocathode 3 to EA surface treatment (i.e., an electron-affinity-lowering treatment; in the present specification, there are also instances where the EA surface treatment is referred to as "restoration") is disposed inside the photocathode-accommodating vessel 8.

In the third embodiment, the control unit 7 performs the EA surface treatment on the photocathode 3 in accordance with measurement results obtained through measurements performed by the measurement unit 6, whereby the intensity of the electron beam B is restored. In the third embodiment, the photocathode-accommodating vessel 8 is such that the surface treatment material 8m (described below) is disposed in the interior and can be vaporized, and also is such that the photocathode 3 can be subjected to EA surface treatment using the vaporized surface treatment material. The photocathode-accommodating vessel 8 includes the electron-beam passage hole 8h, through which at least electrons emitted from the photocathode 3 pass. The electron-beam passage hole 8h is preferably at least large enough to enable passage of electrons. For ease of processing and adjustment of the angle and/or positional relationship of the electron-beam passage hole 8h relative to electrons emitted from the photocathode 3, the electron-beam passage hole 8h may be 1 nm to 10 mm in size, or 50 μm to 5 mm in size.

There is no particular limitation as to the material of the photocathode-accommodating vessel 8. For example, glass, molybdenum, ceramic, sapphire, titanium, tungsten, tantalum, or another heat-resistant material (e.g., a heat-resistant material that can withstand temperatures of 300° C. and above, more preferably 400° C. and above) can be used.

There is no particular limitation as to the surface treatment material 8m disposed inside the photocathode-accommodating vessel 8, provided that it is possible to perform EA surface treatment therewith. Examples of elements that could constitute the surface treatment material 8m include Li, Na, K, Rb, Cs, Te, Sb, etc. Among the aforementioned elements, Li, Na, K, Rb, and Cs in isolation spontaneously combust and cannot be stored or utilized. It is therefore necessary to use the elements Li, Na, K, Rb, and Cs in the form of composite elements, or compounds that include these elements. On the other hand, when these elements are used in compound form, it is necessary to avoid generation of impurity gases during vapor deposition of the aforementioned elements. Consequently, in cases in which an element selected from Li, Na, K, Rb, and Cs is used as the surface treatment material 8m, it is preferable to use $Cs_2CrO_4$, $Rb_2CrO_4$, $Na_2CrO_4$, $K_2CrO_4$, or another compound in combination with a reducing agent that suppresses generation of impurity gases. The surface treatment material 8m is vaporized within the photocathode-accommodating vessel 8 using heating means, and vapor-deposited onto the photocathode 3.

In the third embodiment, when the measurement value obtained through measurement performed by the measurement unit 6 falls below a preset threshold value, the control unit 7 performs a control to cause the photocathode 3 to move to a vapor-deposition position inside the photocathode-accommodating vessel 8 by means of a photocathode-driving device 81, vaporize the surface treatment material 8m, and perform vapor deposition on the photocathode 3, whereby the photocathode 3 is subjected to EA surface treatment. There is no particular limitation as to the photocathode-driving device 81, provided that it is possible to cause the photocathode 3 to move therewith. For example, the driving device disclosed in International Publication No. 2015/008561 or International Publication No. 2018/186294 can be used. Matters disclosed in International Publication No. 2015/008561 and International Publication No. 2018/186294 are included in the present specification.

The control unit 7 can additionally regulate the intensity of the excitation light L with which the photocathode 3 is irradiated from the light source, in the same manner as in the second embodiment, though this is not shown in FIG. 4. For example, it is possible to first adjust the intensity of the electron beam B by adjusting the intensity of the excitation light L, and, when a reduction in the intensity of the electron beam B occurs after the intensity of the excitation light L is saturated, to then perform EA surface treatment on the photocathode 3.

The electron gun 1C in the third embodiment synergistically exhibits the following effect in addition to the effects of the electron guns 1 in the first and second embodiments.

By providing the photocathode-accommodating vessel 8 having the surface treatment material 8m disposed in the interior thereof, it is possible to vapor-deposit the surface treatment material 8m on the photocathode 3 even when the photocathode 3 has degraded. Therefore, the intensity of the electron beam B emitted from the photocathode 3 can be restored at a suitable timing.

Fourth Embodiment

Figure 5:
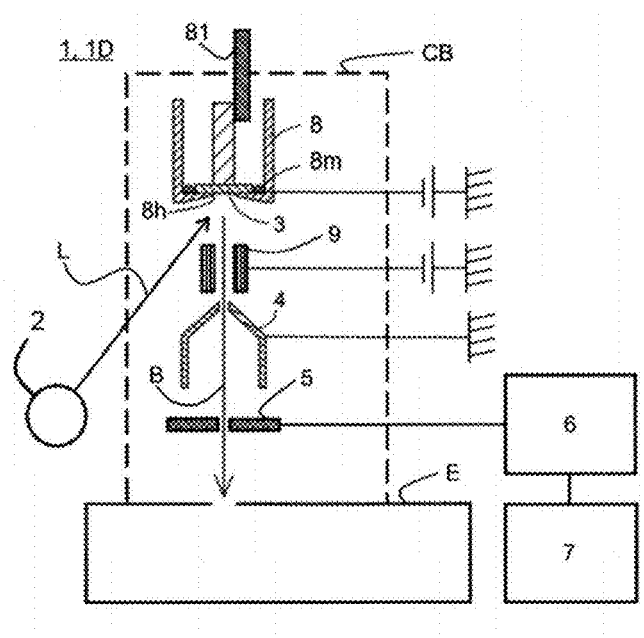
FIG. 5 is a schematic view illustrating an electron gun 1D in a fourth embodiment, and a device equipped with the electron gun 1D.
Figure 6:
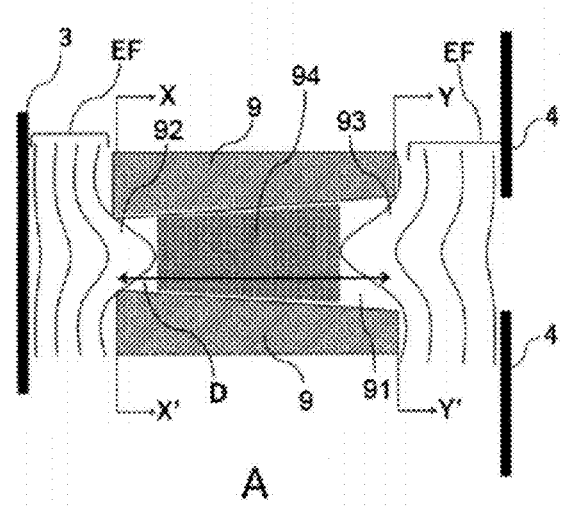
FIG. 6 is a schematic view illustrating an intermediate electrode in the fourth embodiment.
Figure 6:
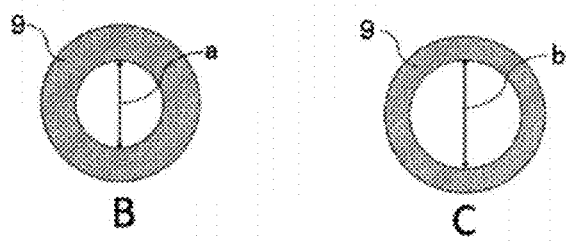
Figure 7:
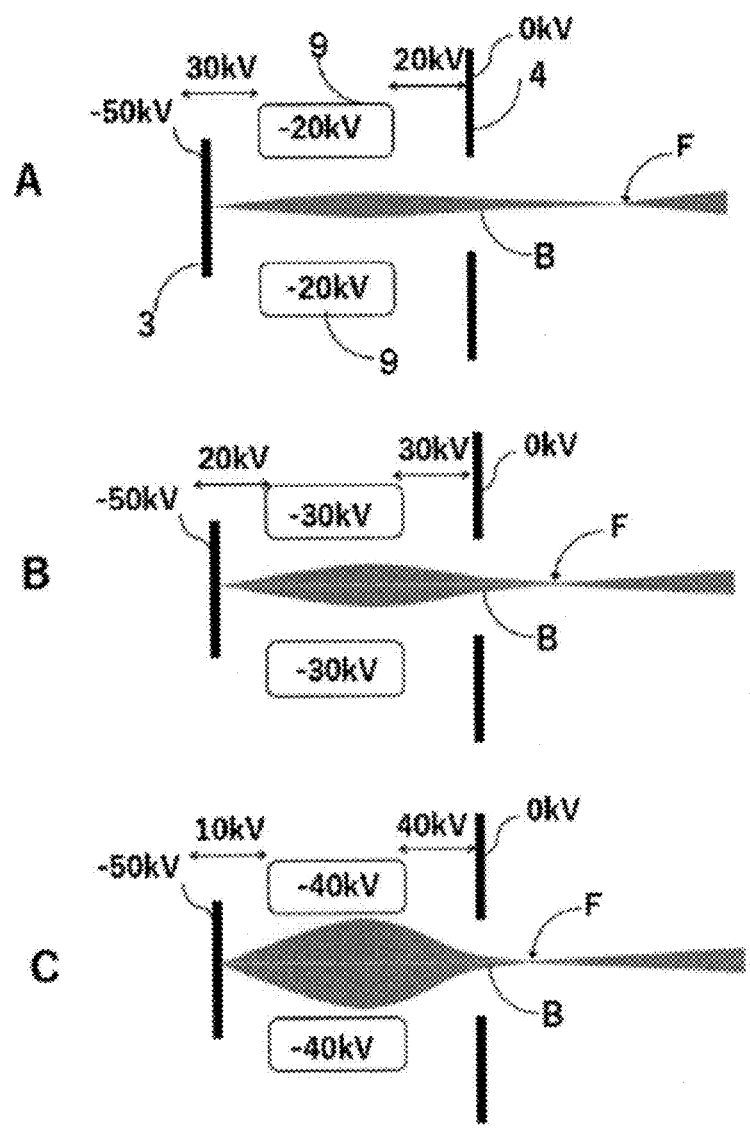
FIG. 7 is a view illustrating examples of adjusting focal distance.

An electron gun 1D in a fourth embodiment is described with reference to FIGS. 5 to 7. FIG. 5 is a schematic view illustrating an example of the electron gun 1D in the fourth embodiment. FIG. 6 is a schematic view illustrating an example of an intermediate electrode in the fourth embodiment. FIG. 7 is a view illustrating examples of adjusting focal distance.

The electron gun 1D in the fourth embodiment comprises at least a light source 2, a photocathode 3, an anode 4, an electron-beam-shielding member 5, a measurement unit 6, and an intermediate electrode 9. The intermediate electrode 9 is disposed between the photocathode 3 and the anode 4, and has an electron-beam passage hole 91 through which the electron beam B emitted from the photocathode 3 passes. The intermediate electrode 9 has a function for changing the width of the electron beam B when the electron beam B passes through the electron-beam passage hole 91 and regulating the focal distance of the electron beam B. In the fourth embodiment, the function of the intermediate electrode 9 for changing the width of the electron beam B is used to acquire a measurement electron beam.

First, the function of the intermediate electrode 9 is described. A drift space in which it is possible to disregard the effect of an electrical field formed due to a difference in potential between the photocathode 3 and the anode 4 is formed in the electron-beam passage hole 91 of the intermediate electrode 9. A voltage that is relatively more positive than a voltage applied to the photocathode 3 and relatively more negative than a voltage applied to the anode 4 is applied to the intermediate electrode 9.

An overview of the intermediate electrode 9 is described with reference to FIG. 6. FIG. 6A is a schematic cross-sectional view of the cathode 3, the intermediate electrode 9, and the anode 4. FIG. 6B is a cross-sectional view along X-X' in FIG. 6A. FIG. 6C is a cross-sectional view along Y-Y' in FIG. 6A. In the example shown in FIG. 6, the intermediate electrode 9 is formed as a hollow cylinder. The electron-beam passage hole 91 through which the electron beam emitted from the photocathode 3 passes is formed in the interior of the intermediate electrode 9, an electron-beam entrance 92 is formed on the photocathode 3 side of the electron-beam passage hole 91, and an electron-beam exit 93 is formed on the anode 4 side of the electron-beam passage hole 91. A voltage is applied so that a difference in potential is generated between the cathode 3 and the anode 4, and a voltage is also applied to the intermediate electrode 9, whereby electrical fields EF are generated between the cathode 3 and the intermediate electrode 9 and also between the intermediate electrode 9 and the anode 4, as shown in FIG. 6A.

As pertains to a range in which the generated electrical field EF strongly affects behavior of the electron beam in a gap, when the opening of the gap is a circle, the range is a sphere including the circle as a largest cross-section. Therefore, when the ratio $D/(a/2+b/2)$ is greater than 1, where a is defined as the diameter of the electron-beam entrance 92 shown in FIG. 6B, b is defined as the electron-beam exit 93 shown in FIG. 6C, and D is defined as the center-axis-direction length of the electron-beam passage hole 91, a drift space 94 that is not affected by the electrical field EF is formed within the electron-beam passage hole 91. In the present specification, the "center-axis direction" refers to a direction in which the center of the electron-beam entrance 92 and the center of the electron-beam exit 93 are connected.

There is no particular limitation as to the material for fabricating the intermediate electrode 9, provided that the material is a conductor. Examples include stainless steel (SUS) and other metals.

FIG. 7 shows an example involving adjustment of a focal position, and moreover shows an example in which the focal position is adjusted by varying the voltage value applied to the intermediate electrode 9 while the difference in voltages applied to the cathode 3 and the anode 4 is fixed. As shown in FIGS. 7A to 7C, the voltage of the cathode 3 is set to −50 kV and the voltage of the anode 4 is set to 0 kV, and the voltage applied to the intermediate electrode 9 is set to −20 kV in FIG. 7A, −30 kV in FIG. 7B, and −40 kV in FIG. 7C. Accordingly, the difference in voltage between the cathode 3 and the intermediate electrode 9 is 30 kV in FIG. 7A, 20 kV in FIG. 7B, and 10 kV in FIG. 7C. Specifically, the difference in potential between the cathode 3 and the intermediate electrode 9 decreases as the voltage applied to the intermediate electrode 9 approaches the voltage of the cathode 3. The density of an equipotential line between the cathode 3 and the intermediate electrode 9 decreases as the difference in potential decreases, and therefore the electron beam B emitted from the photocathode 3 will more likely spread toward the intermediate electrode 9 from FIG. 7A to FIG. 7C in sequence. Furthermore, because the drift space is formed in the intermediate electrode 9, the electron beam B that will more likely spread furthermore spreads inside the drift space.

However, because the difference in potential between the cathode 3 and the anode 4 is fixed, the difference in potential between the intermediate electrode 9 and the anode 4 is the opposite of the difference in potential between the cathode 3 and the intermediate electrode 9. Specifically, because the difference in potential between the intermediate electrode 9 and the anode 4 increases from FIG. 7A to FIG. 7C in sequence, the density of an equipotential line between the intermediate electrode 9 and the anode 4 also increases. Furthermore, because the electron beam increases in width from FIG. 7A to FIG. 7C in sequence after having exited the drift space, the electron beam B that has exited the intermediate electrode 9 more readily converges in the example shown in FIG. 7C than in that shown in FIG. 7A. Specifically, a focal position F can move toward a shorter focal point as the difference in potential between the intermediate electrode 9 and the anode 4 increases. In addition, the focal position can also be adjusted by changing the position and size of the intermediate electrode 9. The intermediate electrode 9 is more specifically described in Japanese Patent No. 6466020, and the matters disclosed in Japanese Patent No. 6466020 are included in the present specification.

Because the electron gun 1D in the fourth embodiment has the intermediate electrode 9, it is possible to adjust the width D1 of the electron beam B upon arrival at the electron-beam-shielding member 5 by adjusting the focal position of the electron beam B. Therefore, it is possible to set the width D1 of the electron beam B upon arrival at the electron-beam-shielding member 5 so as to be less than the width D2 of the hole 51 in the electron-beam-shielding member 5 during normal operation, increase the width D1 of the electron beam B upon arrival at the electron-beam-shielding member 5 by using the intermediate electrode 9 during measurement of the intensity of the electron beam B, and obtain the measurement electron beam. FIG. 5 shows an embodiment comprising the control unit 7 and the photocathode-accommodating vessel 8, but the fourth embodiment comprising the intermediate electrode 9 be combined with any of the first to third embodiments.

The electron gun 1D in the fourth embodiment synergistically exhibits the following effects in addition to the effects of the electron guns 1 in the first to third embodiments.

The intermediate electrode 9 is disposed between the photocathode 3 and the anode 4, whereby it is possible to vary the width of the electron beam B only when the intensity of the electron beam B is being monitored and acquire the measurement electron beam. Therefore, because the electron beam B is not shielded by the electron-beam-shielding member 5 during normal operation, operating efficiency improves. In addition, the intermediate electrode 9, used in applications involving focal point adjustment, can also be used in a new application of acquiring a measurement electron beam.

Fifth Embodiment

Figure 8:
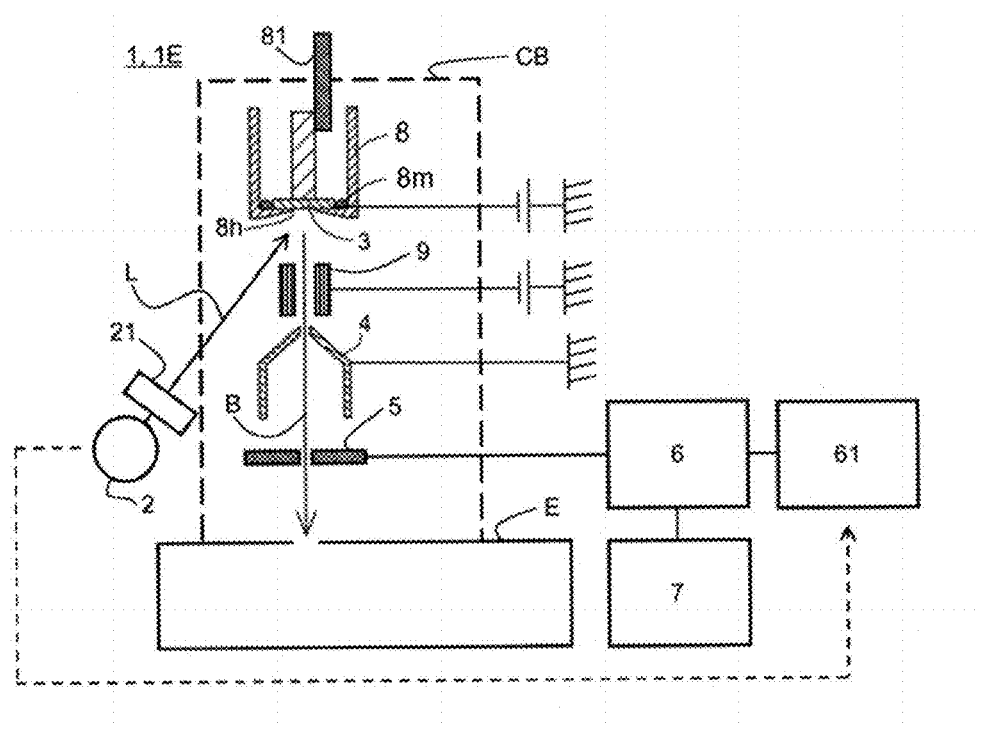
FIG. 8 is a schematic view illustrating an electron gun 1E in a fifth embodiment, and a device equipped with the electron gun 1E.
Figure 9:
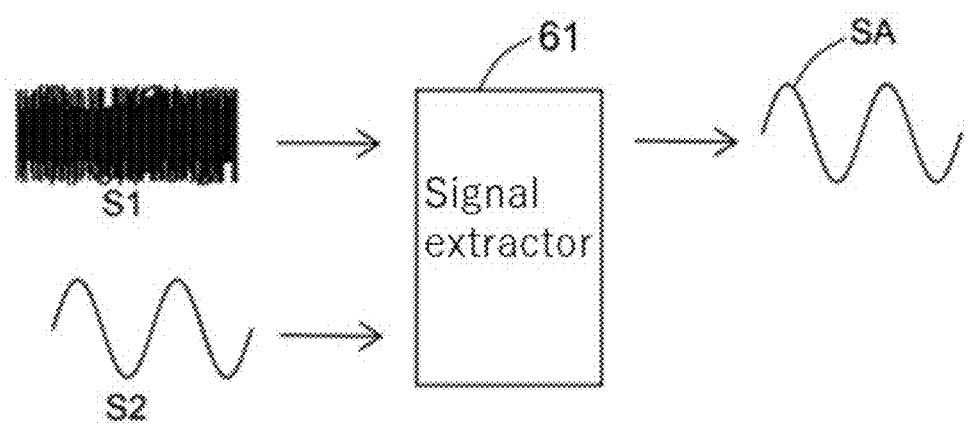
FIG. 9 is a schematic view illustrating a manner in which a signal having a frequency corresponding to a frequency of a reference signal is extracted from within a detection signal.

An electron gun 1E in a fifth embodiment is described with reference to FIGS. 8 and 9. FIG. 8 is a schematic view illustrating an example of the electron gun 1E in the fifth embodiment. FIG. 9 is a schematic view illustrating a manner in which a signal having a frequency corresponding to a frequency of a reference signal S2 is extracted from within a detection signal S1.

The electron gun 1E in the fifth embodiment comprises at least a light source 2, a photocathode 3, an anode 4, an electron-beam-shielding member 5, a measurement unit 6, and a signal extractor 61.

The light source 2 in the fifth embodiment releases frequency-modulated light of which the frequency is modulated. An example is described below in which the light source 2 is a pulse light source for releasing pulse light, which is a type of frequency-modulated light. Alternatively, the light source 2 may be a light source for releasing frequency-modulated light other than pulse light (e.g., a light source for releasing frequency-modulated light, an intensity of which varies sinusoidally). In this case, "pulse light" shall be replaced with "frequency-modulated light" in the description below. The term "frequency-modulated light" in the present specification means light having a periodically varying intensity. The term "pulse light" in the present specification means light from among frequency-modulated light in which periods of essentially zero light intensity are periodically present.

Any configuration can be employed as the light source 2 that releases the frequency-modulated light. As a first example of the light source 2, a pulse light source using a Q-switch pulse oscillator can be used. In this case, a voltage is applied to an electro-optic element included in the light source 2, and a Q value of the electro-optic element thereby changes. As a result, pulse light synchronized with a timing of voltage application is obtained. As a second example of the pulse light source 2, a light source 2 can be used in which a beam output of a continuous laser is turned ON/OFF by a mechanical shutter (including a so-called optical chopper). Pulse light may be generated from a continuous laser beam using a liquid crystal shutter, an electro-optic modulator, or an acousto-optic modulator instead of a mechanical shutter. As a third example of the light source 2, a semiconductor laser light source can be used. In this case, pulse light is obtained by turning ON/OFF an electric current supplied to a semiconductor element. As a fourth example of the light source 2, a pulse light source which utilizes a mode-lock method can be used.

The signal extractor 61 extracts a signal having a frequency corresponding to a pulse frequency of the excitation light L (pulse light released from the light source 2) from within a measurement value S1 obtained through measurement performed by the measurement unit 6. For example, the signal extractor 61 receives the measurement value S1 from the measurement unit 6 and receives a signal corresponding to the pulse waveform of the pulse light from the light source 2 (reference signal S2). The signal extractor 61 extracts a signal SA having a frequency corresponding to a frequency of the aforementioned reference signal S2 from the measurement value S1 received from the measurement unit 6. In the case that the light released from the light source 2 is light other than pulse light, "pulse frequency" shall be replaced with "modulation frequency" (i.e., the frequency of the change in intensity of the frequency-modulated light). Pulse frequency is also a type of modulation frequency.

A publicly known lock-in amplifier, for example, can be used as the signal extractor 61. The lock-in amplifier receives the measurement value S1 and the reference signal S2, and extracts a signal SA having a frequency corresponding to the frequency of the reference signal S2 from the measurement value S1. Alternatively, any electronic circuit (for example, a frequency filter) that extracts a signal having a frequency corresponding to the frequency of the reference signal from within the measurement value obtained through measurement performed by the measurement unit 6 may be used as the signal extractor 61. As another alternative, a computer may be used as the signal extractor 61. In this case, the computer extracts a signal having a frequency corresponding to the frequency of the reference signal from within the detection signal using any computer program for extracting a specific frequency component from a signal which includes noise. For example, signal data corresponding to the measurement value obtained through measurement performed by the measurement unit 6 and frequency data corresponding to the frequency of the reference signal are inputted to the computer, and the computer converts the aforementioned signal data to data of which a frequency component corresponding to the frequency of the reference signal has been modulated, and outputs the data, using the aforementioned computer program.

A control signal for actuating the light source 2 (for example, a voltage signal inputted to an electro-optic element (not shown) of the light source, a drive signal for driving the mechanical shutter of the light source, or an ON/OFF signal inputted to a semiconductor laser) has the same frequency as the pulse frequency of the pulse light. The control signal for actuating the light source 2 can therefore be used as the reference signal inputted to the signal extractor 61. When a laser light source in which a passive Q-switch is used, a laser light source in which a mode-lock method is used, or the like is used as the light source 2, there is no need to send a control signal for frequency modulation to the light source 2. In this case, a portion of the pulse light released from the light source 2 may be received by a photodiode, and an electrical signal generated by this light reception may be used as a reference signal to be inputted to the signal extractor 61.

As illustrated in FIG. 9, a variety of noise is included in the measurement value S1 transmitted from the measurement unit 6 to the signal extractor 61. However, there is a high likelihood that, within the measurement value S1, a signal having a frequency corresponding to the pulse frequency of the excitation light L is generated due to the electron-beam-shielding member 5 receiving the pulsed electron beam B. Specifically, within the measurement value S1, the signal SA having a frequency corresponding to the pulse frequency of the excitation light L can be said to indicate a region irradiated with the pulsed electron beam B (electron-beam-shielding member 5), and to be an electric current value from which noise has been removed, the electric current value accurately reflecting the intensity of the electron beam B.

FIG. 8 shows an embodiment comprising a control unit 7, a photocathode-accommodating vessel 8, an intermediate electrode 9, and an attenuator 21, but the fifth embodiment comprising the signal extractor 61 can be combined with any of the first to fourth embodiments.

The electron gun 1E in the fifth embodiment synergistically exhibits the following effects in addition to the effects of the electron guns 1 in the first to fourth embodiments.

A signal having a frequency corresponding to the pulse frequency of pulse light L is extracted from within the electric current value measured by the measurement unit 6, whereby a noise component included in the electric current value can be effectively removed. Therefore, it is possible to measure variations in the intensity of the electron beam B even when the amount of electrons in the measurement electron beam is low.

Examples of the electron beam applicator E equipped with an electron gun include publicly known devices equipped with electron guns. Examples include free electron laser accelerators, electron microscopes, electron-beam holography devices, electron-beam drawing devices, electron-beam diffraction devices, electron-beam inspection devices, electron-beam metal additive manufacturing devices, electron-beam lithography devices, electron beam processing devices, electron-beam curing devices, electron-beam sterilization devices, electron-beam disinfection devices, plasma generation devices, atomic element generation devices, spin-polarization electron-beam generation devices, cathode luminescence devices, and inverse photoemission spectroscopy devices.

The examples below are presented to specifically describe the embodiments disclosed in the present application, but these examples are provided merely for description of the embodiments. The examples are not provided by way of any limitation or restriction on the claims set forth in the present application.

EXAMPLES

Example 1

A laser light source (iBeamSmart (TOPTICA Photonics AG)) was used as the light source 2. An InGaN photocathode was fabricated according to the publicly known method disclosed by Daiki SATO et al. (2016 Japanese Journal of Applied Physics, vol. 55, 05FH05) as the photocathode 3. An NEA treatment of the photocathode surface was performed according to a publicly known method. Stainless steel was used to fabricate the electron-beam-shielding member 5.

The photocathode 3 was irradiated with laser light from the light source 2, and an acceleration voltage of 30 kV was applied between the photocathode 3 and the anode 4, whereby the electron beam B was emitted from the photocathode 3. A voltage between two ends of a 100-k$\Omega$ shunt resistor was measured by a data logger (MW100 (Yokogawa Electric Corporation)) and converted, whereby the electric current value of the measurement electron beam acquired by the electron-beam-shielding member 5 was acquired. Measurements were carried out at intervals of one second.

Figure 10:
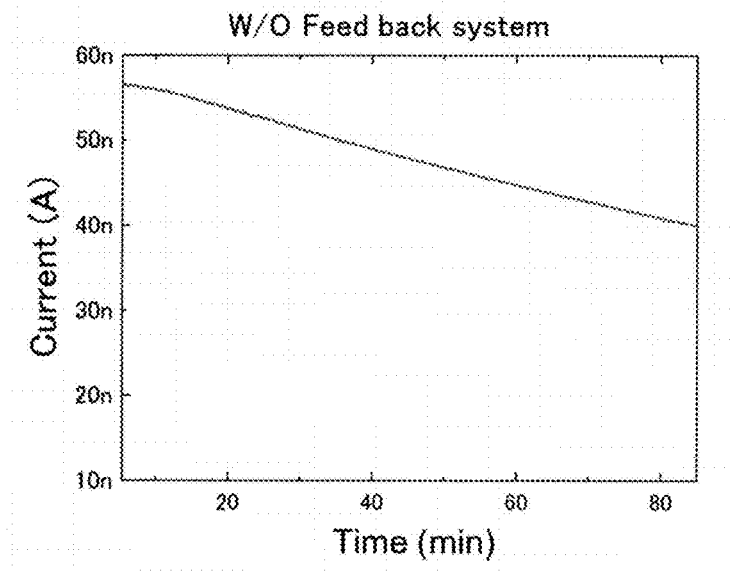
FIG. 10 is a graph showing measurement results in example 1.

The measurement results are shown in FIG. 10. Time is plotted on the horizontal axis, and the electric current value obtained by the measurement unit 6 is plotted on the vertical axis. As shown in FIG. 10, the electric current value decreased over time. This indicates that the photocathode 3 degraded over time and the intensity of the electron beam B decreased. These results confirm that providing the electron-beam-shielding member 5 inside the electron gun and measuring the intensity of the measurement electron beam obtained due to part of the electron beam B being shielded makes it possible to monitor the intensity of the electron beam B in real time.

Example 2

Measurements were carried out using the same procedure as in example 1, except that settings were made so that the electric current value measured by the measurement unit 6 reached about 50 nA, and the results of the electric current value measured by the measurement unit 6 were fed back to the light source 2 at intervals of five seconds.

Figure 11:
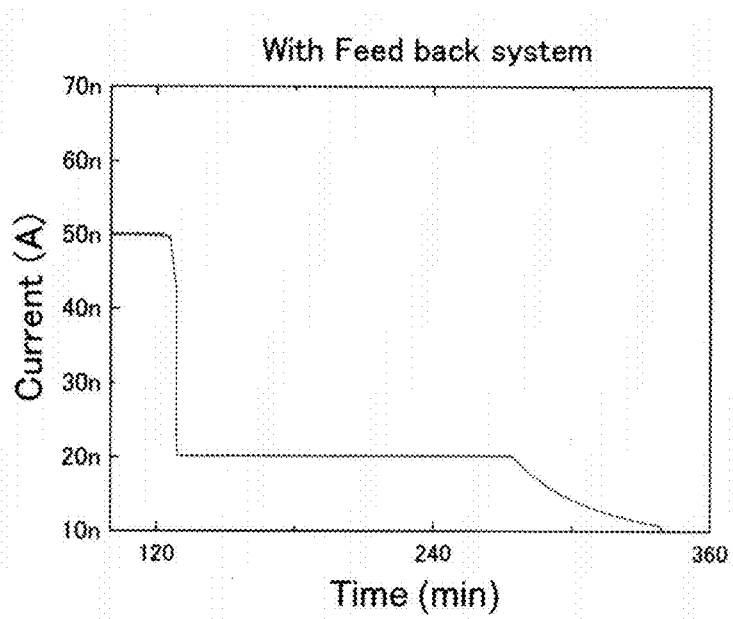
FIG. 11 is a graph showing measurement results in example 2.

The measurement results are shown in FIG. 11. As shown in FIG. 11, it was confirmed that performing feedback control on the basis of the electric current value measured by the measurement unit 6 makes it possible to stably maintain the intensity of the electron beam B as set. In addition, it was confirmed that changing the setting during measurement so that the electric current value measured by the measurement unit 6 changed from 50 nA to 20 nA yielded a prompt change in the intensity of the electron beam B and resulted in stable emission of the electron beam having the set intensity. It was also confirmed that the intensity of the electron beam B decreased in the same manner as in example 1 after the feedback control was stopped.

These results confirm that performing feedback control on the results obtained through measurements performed by the measurement unit 6 using the control unit 7 makes it possible to stably emit an electron beam having a set intensity from the photocathode 3. It was also clarified that because the electron beam having the set intensity can be stably emitted, creating a table from the relationships among the sizes of D1 and D2, the measurement values obtained by the measurement unit 6, and the intensity of the electron beam with which the object to be irradiated with the electron beam B in the counterpart device E is actually irradiated makes it possible to control the intensity of the electron beam (amount of electrons) with which the object in the counterpart device E is actually irradiated according to the configuration adopted on the electron gun 1.

INDUSTRIAL APPLICABILITY

When the electron gun, the electron beam applicator, and the method for controlling an electron gun disclosed in the present application are used, it is possible to monitor the intensity of an electron beam using only the configuration adopted on the electron gun, and to adjust and restore the electron beam intensity at a suitable timing. Therefore, the invention is useful for workers who handle electron guns.

REFERENCE SIGNS LIST

1: electron gun
2: light source
21: attenuator
3: photocathode
4: anode
5: electron-beam-shielding member
51: hole
6: measurement unit
61: signal extractor
7: control unit
8: photocathode-accommodating vessel
81: photocathode-driving device
8$h$: electron-beam passage hole
8$m$: surface treatment material
9: intermediate electrode
91: electron-beam passage hole
92: electron-beam entrance
93: electron-beam exit
94: drift space
B: electron beam
CB: chamber
D1: width of electron beam D2: width of hole
E: counterpart device
L: excitation light
S1: measurement value
S2: reference signal
SA: signal

The invention claimed is:

1. An electron gun comprising
a light source,
a semiconductor photocathode that emits an electron beam in response to receiving light from the light source,
an anode,
an electron-beam-shielding member with which it is possible to shield part of the electron beam,
a measurement unit that measures an intensity change of the electron beam emitted from the semiconductor photocathode due to semiconductor photocathode degradation using a measurement electron beam shielded by the electron-beam-shielding member, and
a control unit that adjusts the intensity of the electron beam emitted from the semiconductor photocathode in accordance with results of measurements performed by the measurement unit,
wherein the electron beam is formed by electrons in which electrons within the semiconductor photocathode are excited by excitation light emitted from the light source, and the excited electrons are emitted from the semiconductor photocathode, and
the control unit controls the light source to vary the intensity of the excitation light with which the semiconductor photocathode is irradiated either when a measurement value falls below a preset threshold value, or in a prescribed period of time on a basis of the measurement value, in order to adjust the intensity of the electron beam emitted from the semiconductor photocathode such that the semiconductor photocathode degradation is compensated.

2. The electron gun according to claim 1,
further comprising a photocathode-accommodating vessel in which the semiconductor photocathode can be accommodated,
a surface treatment material for surface-treating the semiconductor photocathode being disposed inside the photocathode-accommodating vessel, and
the control unit accommodating the semiconductor photocathode inside the photocathode-accommodating vessel and surface-treating the semiconductor photocathode using the surface treatment material.

3. The electron gun according to claim 1,
further comprising an intermediate electrode disposed between the semiconductor photocathode and the anode, the intermediate electrode making it possible to change a width of the electron beam by applying a voltage.

4. The electron gun according to claim 1,
wherein the light source emits frequency-modulated light, and
the measurement unit comprises a signal extractor that extracts a signal having a frequency corresponding to a modulation frequency of the frequency-modulated light.

5. An electron beam applicator comprising the electron gun according to claim 1,
wherein the electron beam applicator is
a free electron laser accelerator,
an electron microscope,
an electron-beam holography device,
an electron-beam drawing device,
an electron-beam diffraction device,
an electron-beam inspection device,
an electron-beam metal additive manufacturing device,
an electron-beam lithography device,
an electron beam processing device,
an electron-beam curing device,
an electron-beam sterilization device,
an electron-beam disinfection device,
a plasma generation device,
an atomic element generation device,
a spin-polarization electron-beam generation device,
a cathode luminescence device, or
an inverse photoemission spectroscopy device.

6. The electron gun according to claim 2,
further comprising an intermediate electrode disposed between the semiconductor photocathode and the anode, the intermediate electrode making it possible to change a width of the electron beam by applying a voltage.

7. The electron gun according to claim 2,
wherein the light source emits frequency-modulated light, and
the measurement unit comprises a signal extractor that extracts a signal having a frequency corresponding to a modulation frequency of the frequency-modulated light.

8. The electron gun according to claim 3,
wherein the light source emits frequency-modulated light, and
the measurement unit comprises a signal extractor that extracts a signal having a frequency corresponding to a modulation frequency of the frequency-modulated light.

9. The electron gun according to claim 6,
wherein the light source emits frequency-modulated light, and
the measurement unit comprises a signal extractor that extracts a signal having a frequency corresponding to a modulation frequency of the frequency-modulated light.

10. A method for controlling an electron gun that monitors an intensity change of an electron beam emitted from a semiconductor photocathode due to semiconductor photocathode degradation comprising:
a light source,
a semiconductor photocathode that emits an electron beam in response to receiving light from the light source,
an anode,
an electron-beam-shielding member with which it is possible to shield part of the electron beam,
a measurement unit that measures the intensity change of the electron beam emitted from the semiconductor photocathode due to semiconductor photocathode degradation using a measurement electron beam shielded by the electron-beam-shielding member, and
a control unit that adjusts the intensity of the electron beam emitted from the semiconductor photocathode in accordance with results of measurement performed by the measurement unit,
wherein the method for controlling an electron gun comprises:
a step for irradiating the semiconductor photocathode with excitation light from the light source, and emitting an electron beam from the semiconductor photocathode in response to receiving the excitation light;

a step for measuring the intensity of the electron beam using the measurement electron beam shielded by the electron-beam-shielding member, and a step for adjusting the intensity of the electron beam emitted from the semiconductor photocathode in accordance with the intensity of the electron beam measured in the step for measuring the intensity of the electron beam;

wherein the electron beam is formed by electrons in which electrons within the semiconductor photocathode are excited by the excitation light emitted from the light source, and the excited electrons are emitted from the semiconductor photocathode, and the control unit controls the light source to vary the intensity of the excitation light with which the semiconductor photocathode is irradiated either when a measurement value falls below a preset threshold value or in a prescribed period of time on a basis of the measurement value, in order to adjust the intensity of the electron beam emitted from the semiconductor photocathode such that the semiconductor photocathode degradation is compensated.

11. The method for controlling an electron gun according to claim 10, wherein a photocathode-accommodating vessel in which the semiconductor photocathode can be accommodated is included, a surface treatment material for surface-treating the semiconductor photocathode is disposed inside the photocathode-accommodating vessel, and the step for adjusting the intensity of the electron beam involves accommodating the semiconductor photocathode inside the photocathode-accommodating vessel and surface-treating the semiconductor photocathode using the surface treatment material.

12. The method for controlling an electron gun according to claim 10, wherein an intermediate electrode disposed between the semiconductor photocathode and the anode is further provided, and the method for controlling an electron gun comprises a step for applying a voltage to the intermediate electrode and changing a width of the electron beam.

13. The method for controlling an electron gun according to claim 10, wherein the excitation light is frequency-modulated light, and the step for measuring the intensity of the electron beam involves extracting and measuring a signal having a frequency corresponding to a modulation frequency of the frequency-modulated light.

* * * * *